(12) United States Patent
Schaffer

(10) Patent No.: US 7,843,261 B2
(45) Date of Patent: Nov. 30, 2010

(54) RESISTOR NETWORK FOR PROGRAMMABLE TRANSCONDUCTANCE STAGE

(75) Inventor: Viola Schaffer, Erlangen (DE)

(73) Assignee: Texas Instrumentsdeutschland GmbH, Freising (DE)

(*) Notice: Subject to any disclaimer, the term of this patent is extended or adjusted under 35 U.S.C. 154(b) by 74 days.

(21) Appl. No.: 12/338,571

(22) Filed: Dec. 18, 2008

(65) Prior Publication Data

US 2009/0184762 A1   Jul. 23, 2009

(30) Foreign Application Priority Data

Jan. 21, 2008   (DE) .................. 10 2008 005 312

(51) Int. Cl.
*H03F 1/34* (2006.01)
(52) U.S. Cl. ......................... 330/86; 330/144
(58) Field of Classification Search ............. 330/86, 330/144, 282, 284
See application file for complete search history.

(56) References Cited

U.S. PATENT DOCUMENTS 5,808,576 A   9/1998   Chloupek et al.
6,693,491 B1 *   2/2004   Delano .................. 330/282
7,162,029 B2   1/2007   Soman et al.

OTHER PUBLICATIONS

Deutsches Patent und Markenamt, Office Action issued regarding German Patent Application DE 10 2008 005 312.0 dated Oct. 16, 2008.

* cited by examiner

*Primary Examiner*—Steven J Mottola
(74) *Attorney, Agent, or Firm*—John J. Patti; Wade J. Brady III; Frederick J. Telecky, Jr

(57) ABSTRACT

A voltage-to-current converter is provided. The voltage-to-current converter comprises an amplifier, a resistor network, an R-2R network, and switches. The amplifier has a first input node (which is an input signal), a second input node, and an output node. The resistor network is coupled to the output node of the amplifier, includes a plurality of resistors coupled in series with on another, and includes a plurality of first tap nodes. The R-2R network is coupled to the resistor network and includes a plurality of second tap nodes. Additionally, at least one switch is coupled between the second input node of the amplifier and each first tap node, and at least one switch is coupled between the second input node of the amplifier and each of the second tap nodes.

11 Claims, 4 Drawing Sheets

RESISTOR NETWORK FOR PROGRAMMABLE TRANSCONDUCTANCE STAGE

CROSS-REFERENCE TO RELATED APPLICATIONS

This application claims priority to German Patent Application No. 10 2008 005 312.0, filed on Jan. 21, 2008, which is hereby incorporated by reference for all purposes.

TECHNICAL FIELD

The present invention relates to an electronic device for voltage-to-current conversion, more specifically to a transconductance stage for generating an output current for a given input voltage.

BACKGROUND

Voltage-to-current converters scale an input voltage into a desired output current. The converters can be used as stand alone voltage-to-current converters but more often are part of a larger system using current mode processing. The transconductance or gain of the voltage-to-current converter is generally referred to as the voltage-to-current scaling ratio, which is set by an impedance and typically by a resistive network. In order to select a desired ratio for various input ranges, a programmable gain stage having a resistive network and switches is generally used. Some examples of amplifier and resistor network arrangements can be seen in U.S. Pat. Nos. 7,162,029 and 5,808,576.

A typical configuration of a voltage-to-current converter, though, is shown in FIG. 1. FIG. 1 shows an amplifier AMP and an R-2R type resistor network. The internal or tap nodes N1 to N5 can be connected through one of the switches S1 to S5 to the negative input of the amplifier AMP. The amplifier AMP forces the voltage Vin to the negative input and the output current I of the amplifier will then assume a magnitude based on the impedance configuration at the negative input configurable by the switches S1-S5. The R-2R resistor network is compact but imposes restraining limitations on the input range of the input voltage Vin as the input signal Vin is gained up to the output of the amplifier, and therefore limited by the output swing capability of the amplifier AMP. If, for example, switch S1 is closed (e.g., conductive) and the other switches S2 to S5 are open (disconnected), the voltage level at node N1 will be Vin. The R-2R network causes the voltage levels to be 2*Vin at node N2, 4*Vin at node N3, 8*Vin at node N4 and 16*Vin at node N5. Therefore, the input voltage range for the input voltage Vin is limited to a maximum of the supply voltage level divided by 16. This limitation is even more restraining for fully differential, such as symmetric structures where the common mode input range is strongly constrained. Furthermore, the approach is also limited due to the voltage feedback gain-bandwidth relationship.

SUMMARY

According to an aspect of the invention, an electronic device is provided which includes a transconductance stage with an amplifier stage and a resistive network. The resistive network comprises a first portion, which is configured as a series of resistors having intermediate tap nodes between the resistors to be selectively connected to an input of the amplifier stage for realizing lower gains of the transconductance stage. The resistive network comprises a second portion, which is configured as an R-2R resistor network having R-2R tap nodes to be selectively connected to the input of the amplifier stage for realizing higher gains of the transconductance stage. According to this aspect of the invention, the typical R-2R network approach is supplemented by an additional resistive network portion (i.e., the first portion). The first portion is then arranged to be used for lower gains of the transconductance stage, which means that the ratio between the output current of the amplifier stage and an input voltage coupled to the input of the amplifier stage is small. The second portion, which is configured as an R-2R resistor network is used for higher gains, i.e., the ratio between the output current and the input voltage is high. In a typical voltage follower configuration, be it asymmetric (single ended) or symmetric (fully differential), the first portion of the resistive network would be arranged between an output of the amplifier stage and the second portion. A special advantage of combining series resistor networks with R-2R resistor networks consists in the number of binary steps that can be implemented by a corresponding number of resistor segments. The number of resistor segments required for a given number of binary steps increases exponentially for a mere series resistor network. For an R-2R resistor network the number of resistors increases only linearly. Therefore, for a given number of binary steps, the resistive network having two portions, which are arranged as set out above can combine the advantages of both network topologies. The transconductance stage according to an embodiment of the invention requires less chip area, has less layout complexity and better matching and therefore less parasitic effects (as, for example, series metal resistance) than prior art solutions. Moreover, an additional degree of freedom is acquired in optimizing the gain network in view of the required bandwidth and chip area.

According to another aspect of the invention, the input range for single ended structures and the common mode and input range for the differential structures can be further improved if the resistive network is arranged such that at least one of the resistors of the first portion can be shorted out when higher gains are realized. For instance, if higher gains should be realized, a current from the output of the amplifier stage is fed into the R-2R network. As the first portion (i.e. the series resistor network) is arranged between the second portion (i.e. the R-2R network) and the output of the amplifier stage, the output current would flow through the series of resistors of the first portion before it enters into the R-R2 network. This means that the output voltage at the amplifier stage output has to be high enough to drive the required current through both networks, in particular the series of resistors of the first portion. In order to avoid such an increase of the output voltage, the output of the amplifier stage can then preferably be coupled directly to the R-2R network bypassing one or more of the series resistors. The electronic device can then be adapted to use a switching scheme that allows resistors of the resistive network to be shorted out by use of the gain selection switches. Therefore, it is then possible to save additional switches and to reduce complexity of the circuitry.

The present invention also relates to a method for adjusting the gain of a transconductance stage by selectively connecting nodes of a resistive network to an operational amplifier input. The resistive network has a first portion being configured as a series resistance and a second portion being configured as an R-2R resistor network. Intermediate tap nodes of the first portion can then be selectively connected to the operational amplifier input for establishing lower gains of the transconductance stage. For establishing higher gains, the R-2R tap nodes of the second portion can be selectively connected to the operational amplifier input. The method according to the present invention allows higher gains to be realized by using the R-2R resistor network portion, whereas the lower gains can be implemented with the series resistance network. With this combination, the critical higher gains profit from the more precise and reliable architecture of the R-2R network. In order to improve the performance, the resistors of the first, i.e., the resistors of the series resistor network can be shorted out in order to realize higher gains without the need for a larger output voltage range. This can be advantageous in order to limit the required output voltage range of the amplifier stage.

Additionally, an embodiment of the invention, accordingly, provides an apparatus. The apparatus comprises an amplifier having a first input node, a second input node, and an output node, wherein the amplifier receives an input signal at the first input node; a resistor network that is coupled to the output node of the amplifier, wherein the resistor network includes a plurality of resistors coupled in series with on another and a plurality of first tap nodes; an R-2R network that is coupled to the resistor network, wherein the R-2R network includes a plurality of second tap nodes; and a plurality of switches, wherein at least one switch is coupled between the second input node of the amplifier and each first tap node, and wherein at least one switch is coupled between the second input node of the amplifier and each of the second tap nodes.

In accordance with an embodiment of the invention, the apparatus further comprises a plurality of second switches, wherein each second switch is coupled between the output node and at least one first tap nodes.

In accordance with an embodiment of the invention, the resistor network further comprises five resistors, wherein the values of the five resistors are integer multiples of one another.

In accordance with an embodiment of the invention, the resistor network further comprises a first resistor coupled to the output node; a second resistor coupled to the first resistor, wherein the value of the second resistor is half of the value of the second; a third resistor coupled to the second resistor, wherein the value of the third resistor is half of the value of the second resistor; a fourth resistor coupled to the third resistor, wherein the value of the fourth resistor is half of the value of the third resistor; and a fifth resistor coupled to the fourth resistor, wherein the value of the fifth resistor is half of the value of the fourth resistor.

In accordance with an embodiment of the invention, the R-2R network has five stages.

In accordance with an embodiment of the invention, at least one switch is coupled between the second input node of the amplifier and the node between the resistor network and the R-2R network.

In accordance with an embodiment of the invention, the apparatus further comprises a current source that is coupled to the amplifier and that is adapted to provide current to the resistor network and the R-2R network.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
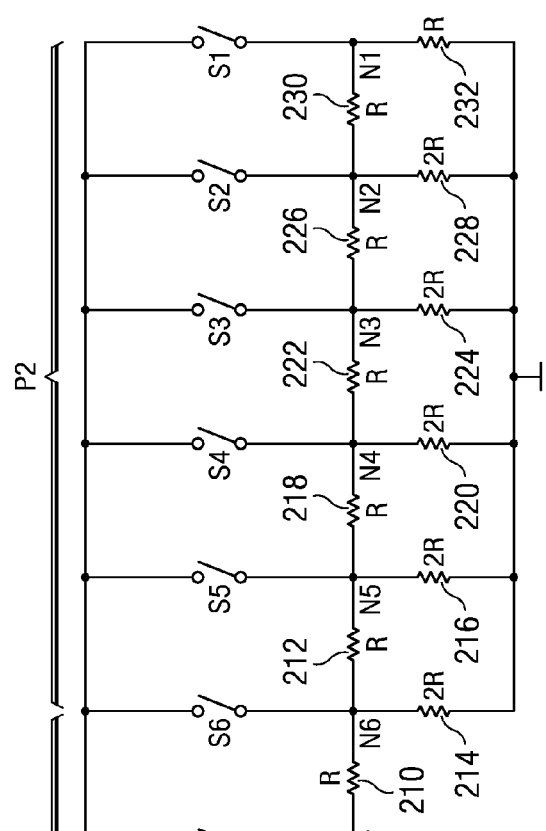
FIG. 1 depicts a prior art circuit.

Refer now to the drawings wherein depicted elements are, for the sake of clarity, not necessarily shown to scale and wherein like or similar elements are designated by the same reference numeral through the several views.

Figure 2:
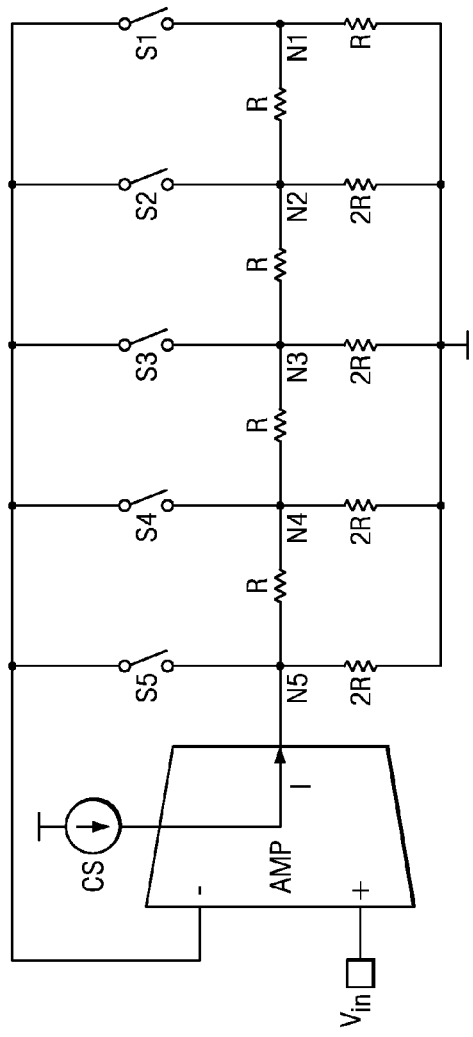
FIG. 2 depicts a voltage-to-current converter in accordance with an embodiment of the invention.
Figure 2:
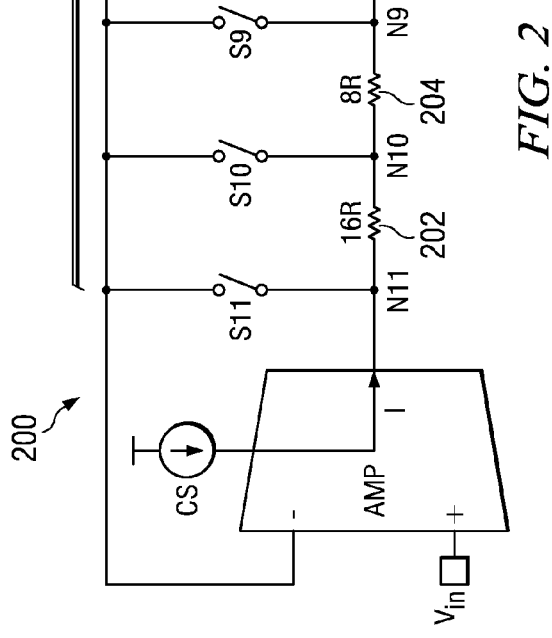

Referring to FIG. 2 of the drawing the reference numeral 200 generally designates a voltage-to-current converter in accordance with a preferred embodiment of the invention. Converter 200 generally comprises a current source CS, an amplifier AMP, and a resistor network. The resistor network is generally comprised of a resistor network P1 and R-2R network P2. Amplifier or amplifier stage AMP is preferably a transconductance stage or amplifier having a first input node (non-inverting input), a second input node (inverting input), and an output node. Resistor network P1 (which is generally comprised of resistors 202, 204, 206, 208, and 210) is coupled to the output node of amplifier AMP and is generally comprised of a plurality of resistors coupled in series with one another, which are binary weighted. R-2R network (which is generally comprised of resistors 212, 214, 216, 218, 220, 222, 224, 226, 228, 230, and 232) is also coupled to the resistor network P1.

Within the resistor network P1 and the R-2R network, there are tap nodes. The first tap nodes or tap nodes for the resistor network P1 are nodes N7 through N11, while the second tap nodes or tap nodes for the R-2R network P2 are N1 to N6. Each of the tap nodes N1 to N11 can be connected to the negative input or second input node of the amplifier stage AMP through one of the switches S1 to S11. The converter 200 would typically be implemented by use of unit resistors of a resistance value R or that each resistor value would be an integer multiple value of R. Preferably, the values of resistors 210, 212, 218, 222, 226, 230, and 232 would be R, while the values of resistors 208, 214, 216, 220, 224, and 228 would be 2R. Additionally, the values of resistors 202, 204 and 206 would be 16R, 8R, and 4R, respectively. Also, the total number of resistor segments for the networks P1 and P2, preferably, shown in FIG. 2 is 47 compared to 1024, which would be generally be employed required, if the whole network was implemented by use of a mere series resistor string. The basic application of the converter 200 involves adjusting the output current I drawn from the current source CS for a given input voltage Vin. This is performed by switching a specific tap node N1 to N11 through one of the switches S1 to S11 to the negative input of the amplifier AMP.

Figure 3:
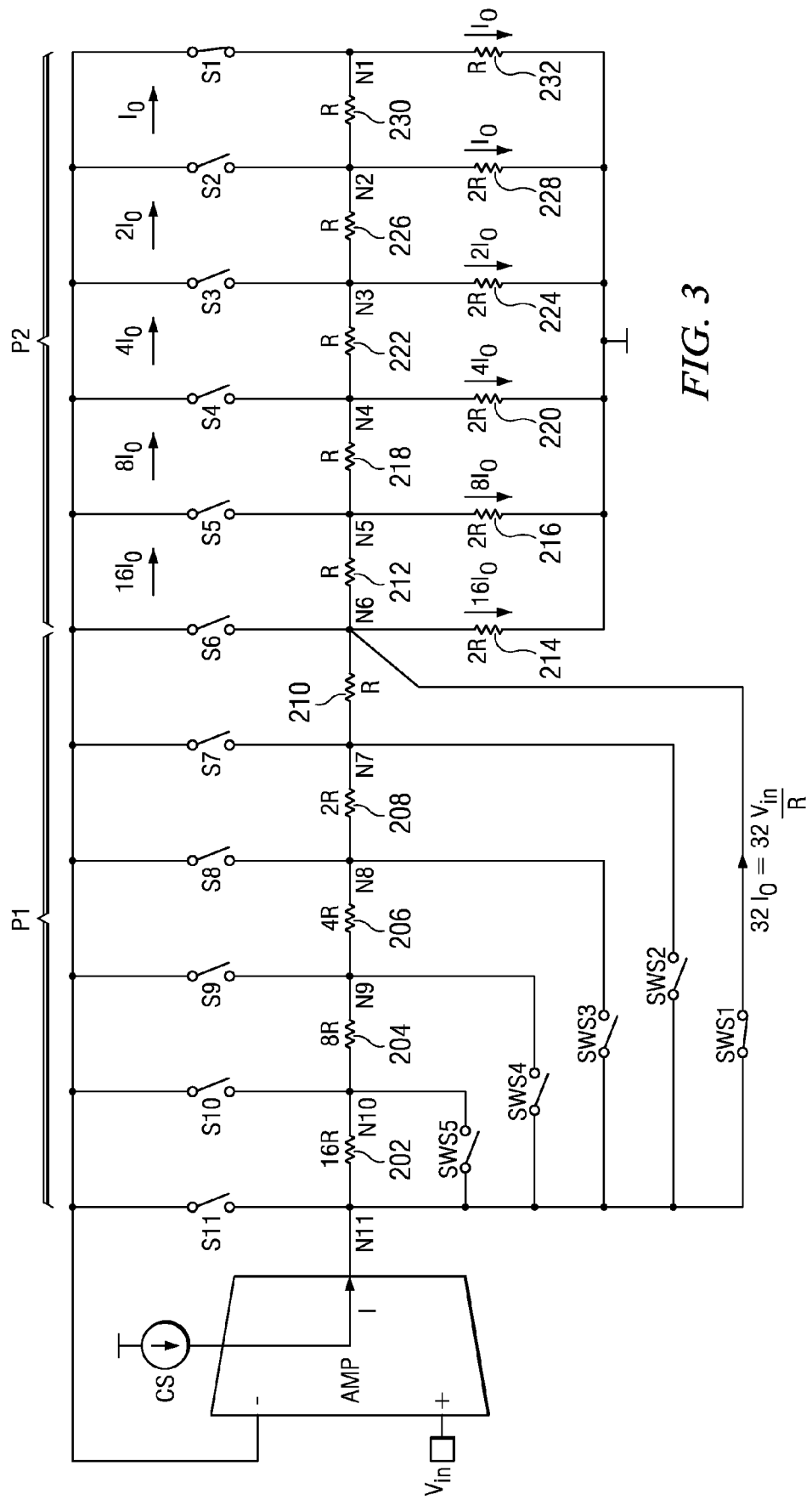
FIGS. 3-5 show a voltage-to-current converter having setting or second switches in various configurations in accordance with an embodiment of the invention.

Now turning to FIG. 3 of the drawings, the reference numeral 300 depicts a voltage-to-current converter having second switches in accordance with an embodiment of the invention. Second switches are comprised of switches SWS1 to SWS5, which are preferably coupled between the output node of the amplifier AMP and a tap node N6 though N10. Switches SWS1 to SWS5 are generally employed to "short out" or bypass one or more of the resistors of the resistor network P1, if a high gain value should be realized by use of the R-2R network alone. The configuration shown in FIG. 3 relates to a high gain, i.e., a large ratio of the output current I. The current I is provided by the current source CS with respect to the input voltage Vin. Accordingly, the R-2R network P2 is used for realizing the high gain.

In one example, as shown in FIG. 3, switches SWS1 and S1 are closed. After the amplifier AMP has settled, the negative input node or second node assumes the same voltage level as the positive input node or first input node, i.e., the voltage level at the first node is Vin. Therefore, tap node N1 has the voltage level Vin as well. The current through resistor 232 draws a current $I_0$ from tap node N1. Due to the topology of the R-2R network P2, the voltages at tap nodes N2, N3, N4, N5 and N6 are 2*Vin, 4*Vin, 8*Vin, 16*Vin and 32*Vin, respectively. The currents for each branch (resistors 214, 216, 220, 224, and 228) is $16I_0$, $8I_0$, $4I_0$, $2I_0$, and $I_0$, respectively. The current that provided by the output of the amplifier AMP is then $32I_0$ which is equal to 32Vin/R. The gain G amounts therefore to G=32/R.

Figure 4:
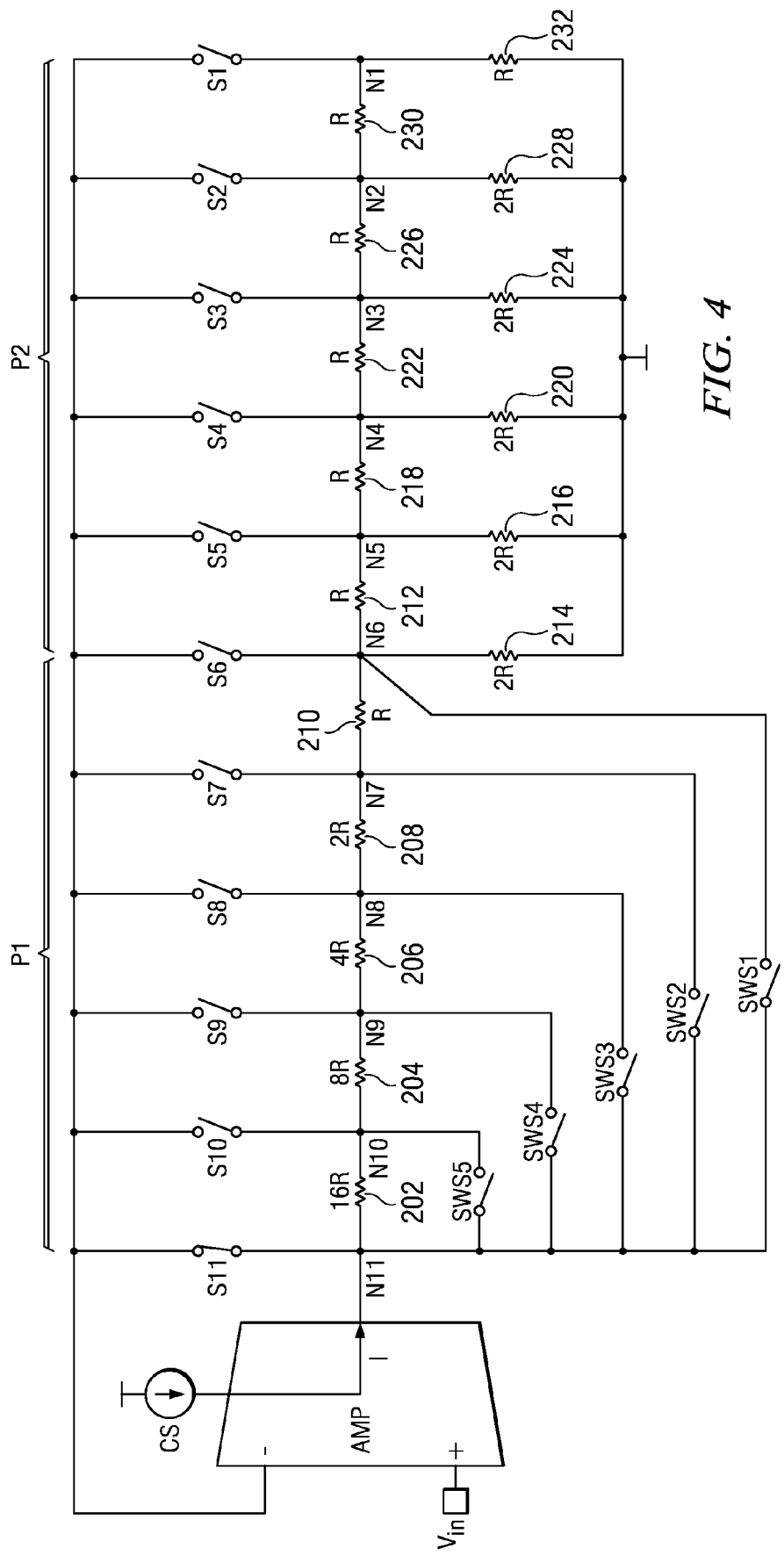

In another example, as shown in FIG. 4, a low gain configuration for the circuit of FIG. 3 is shown. In this configuration, switch S11 is closed. In order to establish the input voltage Vin at the negative input or second input node of the amplifier AMP, the amplifier AMP is generally driven to a current I through networks P1 and P2. Due to the topology of the R-2R network P2, the input resistance at node N6 is R. Therefore, the resistance seen from the output node or tap node N11 is generally 32R. Therefore, the output current is Vin/32R, and the corresponding gain is G=1/32R.

Figure 5:
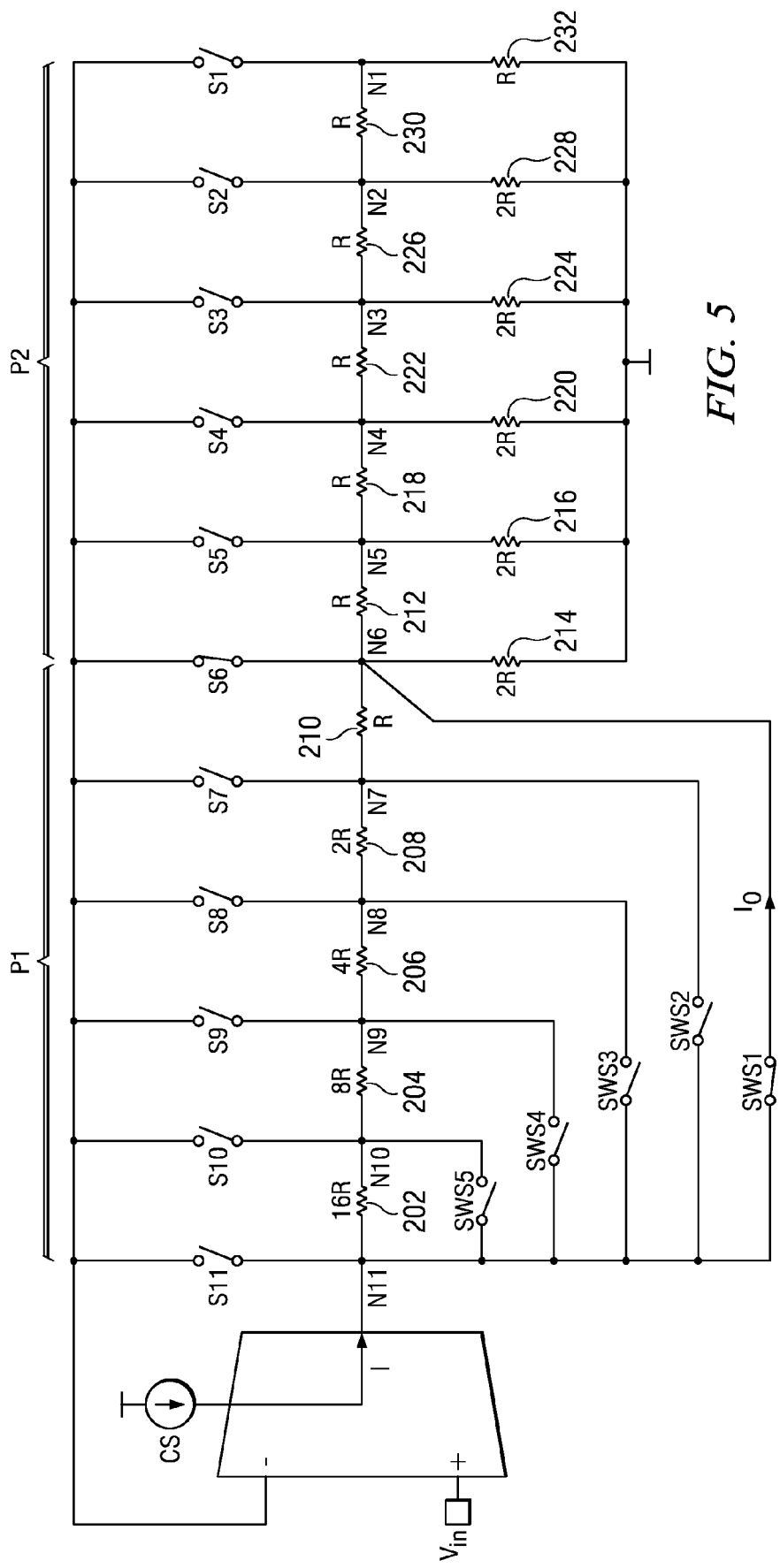

In yet another example, as shown in FIG. 5, a third configuration of the switches in order to establish the low gain with the R-2R network P2. In this configuration, Switches SWS1 and S6 are closed. The input resistance at node N6 of the R-2R networks P2 is R. Therefore, the output current is Vin/R, and the gain amounts to G=1/R.

Although the embodiments shown in FIGS. 2 to 5 are single ended architectures, the present invention applies equally to fully differential implementations without substantial changes. The standard use of the switches S1 to S11 is to close only one of the switches at the time and leave the other switches open. However, a more sophisticated switching scheme can be used to provide additional operating range or intermediate steps. Furthermore, the switches SWS1 to SWS5, or at least some of these switches are not needed, if a specific switching scheme for switches S11 to S6 is used. By use of switches S11 to S6, it is possible to bridge one or more of the resistors in network P1.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    an amplifier having a first input node, a second input node, and an output node, wherein the amplifier receives an input signal at the first input node;
    a resistor network that is coupled to the output node of the amplifier, wherein the resistor network includes a plurality of resistors coupled in series with one another and a plurality of first tap nodes, wherein the resistor network further comprises five resistors, wherein the values of the five resistors are integer multiples of one another;
    an R-2R network that is coupled to the resistor network, wherein the R-2R network includes a plurality of second tap nodes; and
    a plurality of switches, wherein at least one switch is coupled between the second input node of the amplifier and each first tap node, and wherein at least one switch is coupled between the second input node of the amplifier and each of the second tap nodes.

2. The apparatus of claim 1, wherein the apparatus further comprises a plurality of second switches, wherein each second switch is coupled between the output node and at least one first tap nodes.

3. The apparatus of claim 1, wherein the resistor network further comprises:
    a first resistor coupled to the output node;
    a second resistor coupled to the first resistor, wherein the value of the second resistor is half of the value of the second;
    a third resistor coupled to the second resistor, wherein the value of the third resistor is half of the value of the second resistor;
    a fourth resistor coupled to the third resistor, wherein the value of the fourth resistor is half of the value of the third resistor; and
    a fifth resistor coupled to the fourth resistor, wherein the value of the fifth resistor is half of the value of the fourth resistor.

4. The apparatus of claim 1, wherein the R-2R network has five stages.

5. The apparatus of claim 1, wherein at least one switch is coupled between the second input node of the amplifier and the node between the resistor network and the R-2R network.

6. An apparatus comprising:
    an amplifier having a first input node, a second input node, and an output node, wherein the amplifier receives an input signal at the first input node;
    a resistor network that is coupled to the output node of the amplifier, wherein the resistor network includes a plurality of resistors coupled in series with one another and a plurality of first tap nodes;
    an R-2R network that is coupled to the resistor network, wherein the R-2R network includes a plurality of second tap nodes;
    a plurality of switches, wherein at least one switch is coupled between the second input node of the amplifier and each first tap node, and wherein at least one switch is coupled between the second input node of the amplifier and each of the second tap nodes; and
    a current source that is coupled to the amplifier and that is adapted to provide current to the resister network and the R-2R network.

7. The apparatus of claim 6, wherein the apparatus further comprises a plurality of second switches, wherein each second switch is coupled between the output node and at least one first tap nodes.

8. The apparatus of claim 6, wherein the resistor network further comprises five resistors, wherein the values of the five resistors are integer multiples of one another.

9. The apparatus of claim 6, wherein the resistor network further comprises:
    a first resistor coupled to the output node;

a second resistor coupled to the first resistor, wherein the value of the second resistor is half of the value of the second;

a third resistor coupled to the second resistor, wherein the value of the third resistor is half of the value of the second resistor;

a fourth resistor coupled to the third resistor, wherein the value of the fourth resistor is half of the value of the third resistor; and a fifth resistor coupled to the fourth resistor, wherein the value of the fifth resistor is half of the value of the fourth resistor.

10. The apparatus of claim 6, wherein the R-2R network has five stages.

11. The apparatus of claim 6, wherein at least one switch is coupled between the second input node of the amplifier and the node between the resistor network and the R-2R network.

* * * * *